United States Patent
Yong (10) Patent No.: US 6,628,465 B2
(45) Date of Patent: Sep. 30, 2003

(54) MAGNETIC MEDIA DEFECT DETECTION APPARATUS AND METHOD

(75) Inventor: Philip Yong, Hsinchu (TW)

(73) Assignee: Trace Storage Technologies Corporation, Hsinchu (TW)

(*) Notice: Subject to any disclaimer, the term of this patent is extended or adjusted under 35 U.S.C. 154(b) by 311 days.

(21) Appl. No.: 09/793,748

(22) Filed: Feb. 27, 2001

(65) Prior Publication Data

US 2002/0118473 A1 Aug. 29, 2002

(51) Int. Cl.[7] ............................................... G11B 27/36
(52) U.S. Cl. ............................ 360/31; 360/53; 360/69; 360/75
(58) Field of Search .................................. 324/210, 212, 324/226; 360/31, 25, 53, 69, 75, 78.04

(56) References Cited

U.S. PATENT DOCUMENTS

| | | | |
|---|---|---|---|
| 4,203,137 A | * | 5/1980 | Beck et al. .................... 360/31 |
| 4,881,136 A | | 11/1989 | Shiraishi et al. |
| 4,929,894 A | | 5/1990 | Monett |
| 5,121,057 A | | 6/1992 | Huber et al. |
| 5,424,638 A | | 6/1995 | Huber |
| 5,841,752 A | | 11/1998 | Ohmori et al. |
| 5,844,865 A | | 12/1998 | Bakx |
| 5,859,740 A | | 1/1999 | Takeda et al. |
| 5,864,527 A | | 1/1999 | Okabe |
| 5,867,463 A | | 2/1999 | Chiba |
| 5,870,367 A | | 2/1999 | Yamamori |
| 5,889,631 A | | 3/1999 | Hobson |
| 5,896,250 A | | 4/1999 | Chiba et al. |
| 5,901,010 A | | 5/1999 | Glover et al. |
| 5,905,705 A | | 5/1999 | Takeda et al. |

* cited by examiner

Primary Examiner—Alan T. Faber
(74) Attorney, Agent, or Firm—Finnegan, Henderson, Farabow, Garrett & Dunner, LLP (57) ABSTRACT

Apparatus for detecting defects in a magnetic disk includes a read head including multiple read elements for reading multiple tracks of the disk. Read signals produced by the read elements are received by certifier circuit portions for determining whether any of the read signals includes an indication of a defect in the disk. A monitoring circuit monitors the read elements to detect a malfunctioning read element. The read head position is controlled so that a malfunctioning read element is not used.

15 Claims, 9 Drawing Sheets

MAGNETIC MEDIA DEFECT DETECTION APPARATUS AND METHOD

BACKGROUND OF THE INVENTION

1. Field of the Invention

The present invention relates to apparatus and method for detecting defects in a storage medium and, more particularly, for detecting defects in a high density storage medium such as a magnetic disk.

2. Description of the Related Art

Magnetic storage media, such as hard disks or floppy disks, are comprised of a substrate upon which is coated a thin layer of magnetic material. Small defects or flaws can exist in the thin film layer of magnetic material on a disk or the disk substrate, e.g., pits, plating pin holes, and residual polishing scratches which cannot be removed by a texturing process. Such defects can result in writing and reading of erroneous data bits. Such erroneous bits are created when data is written into a defective area of the disk and subsequently read out from the disk. A data bit error for a particular bit is caused either by the magnetization of a bit being missing or by demagnetization being added at the storage location.

In order to test and identify defects in the layer of magnetic material or disk substrate, a typical prior art technique used by manufacturers of magnetic media is to perform a surface analysis of the layer of magnetic material and produce an error map for the surface of the disk. The error map is then written on the disk for future reference to avoid the defective areas of the disk during subsequent recording and playback of data. Alternatively, if the disk contains an unacceptable number of defects, it may be wholly rejected.

Various techniques are known for performing the surface analysis. One technique for performing the surface analysis involves writing a test signal such as a high frequency, alternating data pattern onto the disk. This pattern is then read from the disk as a high frequency output test signal which has a sinusoidal waveform consisting of sinusoidal data pulses corresponding to the recorded data bits of the test signal. The sinusoidal data pulses are monitored for deviations from the expected waveform of the pulses to indicate the occurrence of a defect on the disk. For example, the peaks of the output data pulses may be compared to a threshold amplitude. If a peak amplitude of an output pulse is less than the threshold, the location on the disk corresponding to the pulse is determined to contain a defect. In accordance with another technique, the phase of the output test signal is monitored. An output data pulse that occurs with a shifted phase, i.e., occurs outside an expected time window of occurrence, may be determined to correspond to a defect in the disk.

A summary of such conventional defect testing techniques is disclosed in U.S. Pat. No. 4,929,894.

Separately, developments in magnetic recording media materials and media manufacturing techniques as well as read/write head and disk drive design, have resulted in continuously increasing recording capacities. These increasing capacities correspond to an increase in the recording density of magnetic media as expressed in recordable bits per unit area, e.g., gigabits per square inch ($Gbits/in.^2$). For example, recent recording density requirements have reached 8 $Gbits/in.^2$. With this increase in recording density, the size of a defect in the layer of magnetic material that can cause an error has correspondingly decreased.

As recording density increases, the time required for a manufacturer of magnetic media to test the integrity of the media also increases. The density of data per unit area, i.e., areal density, for which the media must be capable can be expressed as: Areal Density=Bit Density×Track Density. Thus, manufacturing throughput may be reduced as a result of increased recording density. One solution that has been practiced to obviate this difficulty is to test less than 100% of the magnetic media surface for defects. The result of this solution is a magnetic disk that may contain defects that cause data errors during operation. This, in turn, may cause customer dissatisfaction and decreased sales.

Another solution is to use a wider read/write head to test the integrity of the magnetic medium than would be required to write and read data with the intended data recording density. This solution results in a reduced sensitivity to defects during performance of the surface analysis with the result that smaller defects may not be detected even though such smaller defects may nevertheless be sufficiently large to cause read/write errors for the intended high recording density application. Again, the result is a magnetic disk that may contain defects that cause data errors during operation.

Additionally, malfunctioning of apparatus for testing the integrity of the magnetic medium may lead to failure to detect defects or falsely indicating defects. The former case may result in selling a magnetic disk that causes data errors during operation and consequent customer dissatisfaction. The latter case may result in a decision to reject an otherwise acceptable disk.

SUMMARY OF THE INVENTION

Accordingly, the present invention is directed to apparatus and method for testing storage media, including magnetic storage media, that substantially obviates one or more of the problems due to limitations and disadvantages of the prior art.

To achieve these and other advantages and in accordance with the purpose of the invention, as embodied and broadly described herein, there is provided apparatus for reading a plurality of information tracks in a magnetic storage medium, comprising: a read head including a plurality of read elements each producing a read signal in response to data stored in the tracks of the storage medium; and an element monitoring circuit to monitor the plurality of elements and provide an indication when one of the elements malfunctions.

Also in accordance with the present invention there is provided apparatus for reading a plurality of information tracks in a magnetic storage medium, comprising: a read head including a plurality of read elements each producing a read signal in response to data stored in the storage medium; means for storing ones of the read signals output by a selected one of the read elements; and means for comparing at least one of the stored read signals with at least one subsequent read signal output by the selected read element, for determining whether the selected read element malfunctions, and for providing an indication when the read element malfunctions.

Further in accordance with the present invention there is provided a method for reading a plurality of information tracks in a magnetic storage medium, comprising: producing read signals from a plurality of read elements in response to data stored in the track of the storage medium; monitoring the plurality of read elements to determine when any one of the read elements malfunctions; and providing an indication when any one of the read elements is determined to be malfunctioning.

Additionally in accordance with the present invention there is provided a method for reading a plurality of information tracks in a magnetic storage medium, comprising: producing read signals from a plurality of read elements in response to data stored in the storage medium; storing ones of the read signals output by a selected one of the read elements; and comparing at least one of the stored read signals with at least one subsequent read signal output by the selected read element; determining whether the selected read element is malfunctioning based on a result of the comparing; and providing an indication when the selected read element is malfunctioning.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Embodiments consistent with the present invention overcome the disadvantages of the prior art by utilizing a read head with more than one read element to read test signals from multiple tracks of a recording medium being tested. The multiple signals respectively generated by the more than one read elements are processed by one or more certifying circuits to determine whether any unacceptable defects are present in the storage medium being tested. The multiple read elements are monitored to detect a malfunctioning read element and the read head is controlled to assure a malfunctioning read element is not used for defect detection.

Figure 1A:
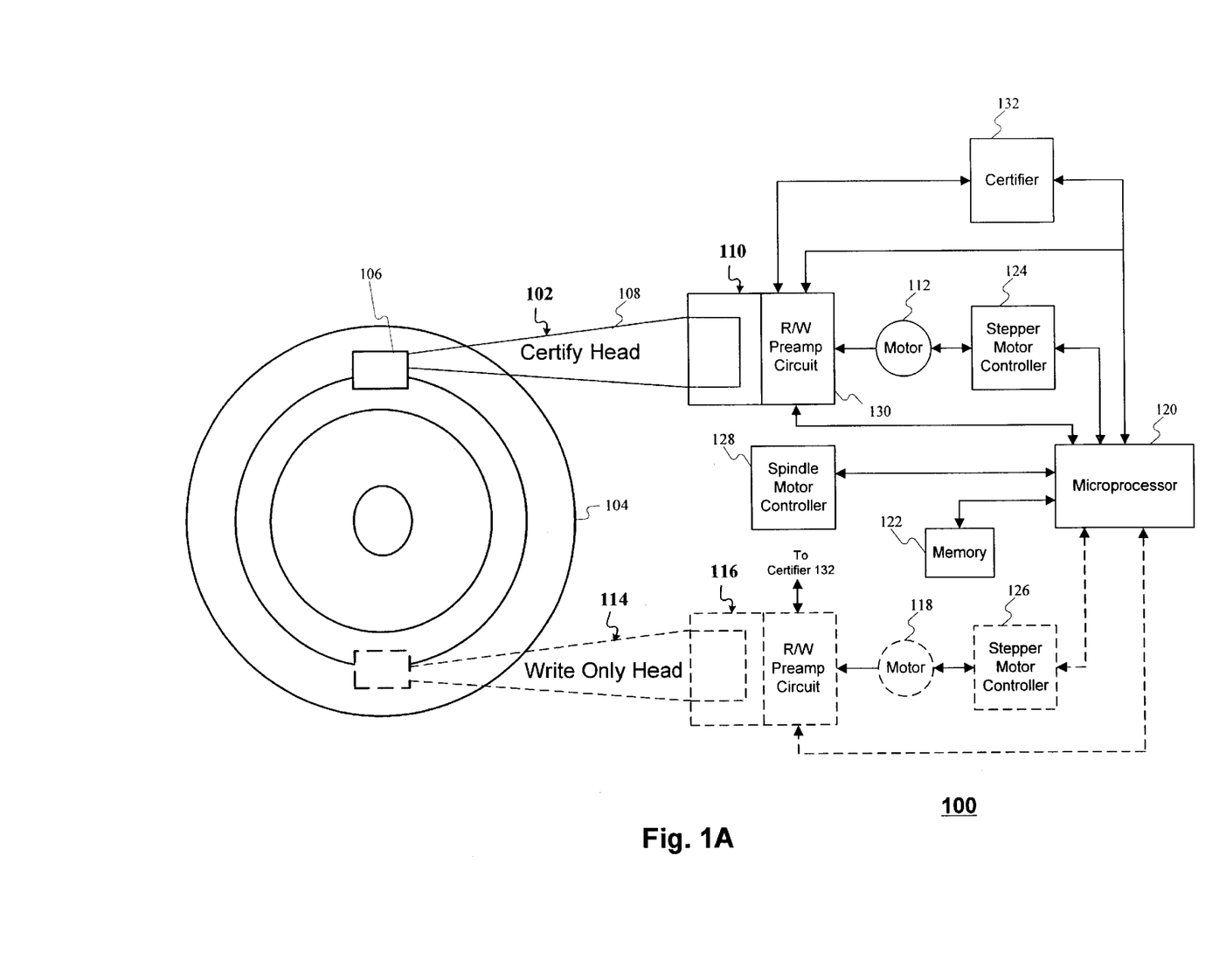
FIGS. 1A and 1B illustrate general arrangements of embodiments of defect detection apparatus consistent with the present invention FIG. 2 schematically illustrates positioning of a certify head over tracks of a hard disk.

FIG. 1A illustrates the general arrangement of a defect detection apparatus 100 consistent with the present invention. Apparatus 100 includes a certify head 102 for reading a test pattern written on a magnetic medium such as a hard disk 104 being tested for the presence of defects in its layer of magnetic material and in the underlying substrate. Certify head 102 includes a read/write head 106 that is positioned over hard disk 104 by a load beam 108. One end of load beam 108 is attached to head 106 and its opposite end is attached to a head loading mechanism (HLM) or cartridge 110. HLM 110 is radially moved inward and outward relative to hard disk 104 by a high precision linear stepper motor 112. The particular step size resolution required for stepper motor 112 is dictated in part by the recording density of hard disk 104. For example, for recording densities discussed herein, motor 112 should be capable of effecting step size movements of 0.1 microns or less.

With certify head 102 constructed to include read/write head 106, head 102 is used during defect testing both for writing a test pattern onto hard disk 104 and subsequently reading the test pattern. Alternatively, certify head 102 can be used for reading the test pattern and a separate write only head 114 can be provided only for writing the test pattern. Thus, when write only head 114 is provided, it is not necessary to include write elements on certify head 102.

Head 114, when provided, has one end attached to an HLM 116 which is, in turn, radially moved over hard disk 104 by a high precision linear stepper motor 118.

A microprocessor 120 is included in apparatus 100 to control functions performed therein. A memory 122 is coupled to microprocessor 120 for temporarily storing information regarding defects detected on the hard disk 104 being tested. One function controlled by microprocessor 120 is the operation of stepper motor 112 and stepper motor 118. A stepper motor controller 124 is coupled between motor 112 and microprocessor 120 to facilitate control of motor 112 operations. Similarly, a stepper motor controller 126 is coupled between motor 118 and microprocessor 120.

Microprocessor 120 and memory 122 can be embodied in a personal computer (PC) with microprocessor 120 coupled to the other elements of apparatus 100 as shown in FIG. 1A. In such case, a hard disk drive storage device of the PC can also be used to store the information regarding defects detected on hard disk 104.

Motor 112 is controlled by stepper motor controller 124 to radially move head 106 in discrete steps of a predetermined size either inward toward the center of hard disk 104 or outward away from the center. Microprocessor 120 is programmed to control the operation of controller 124 and move head 106 to successive desired positions. More particularly, since the step size (SS) of each step movement caused by motor 112 is known, microprocessor 120 can determine the radial position of head 106. For example, for movement of head 106 from the outer periphery of hard disk 104 toward the disk center, and assuming that the radial position of head 104 has a maximum value of "outer radius" (OR) at the hard disk periphery, the "current position" (CP) of head 106 is given by:

$$CP = OR - \text{number of movements} \times SS.$$

Alternatively, if head 106 is moved outward from the center of hard disk 104 and assuming the innermost radial position of head 106 is IR, the current position of head 106 is given by:

$$CP = IR + \text{number of movements} \times SS.$$

A spindle motor controller 128 controls rotation of a spindle motor, not shown, for rotating hard disk 104. Microprocessor 120 is coupled to controller 128 to control the spindle motor speed of operation and to determine the instantaneous circumferential position of hard disk 104 during rotation. For this purpose, the shaft of the spindle motor is preferably monitored to generate an index signal upon completion of each revolution of hard disk 104. The circumferential position information is necessary to enable identifying the physical location of defects on disk 104, as more fully described below.

The nature of the test pattern being written and circuitry for generating such a test pattern are conventional and may be of the type described above. A read/write preamplifier circuit 130 is coupled to read/write head 106. Circuit 130 functions as a current generator to magnetize hard disk 104 through head 106 to write data, such as a test pattern. Circuit 130 also functions as a differential amplifier to read data signals from hard disk 104 for further processing in accordance with embodiments of the invention.

A certifier circuit 132 is coupled between circuit 130 and microprocessor 120. Certifier circuit 132 receives the read signals from hard disk 104 provided by circuit 130 and evaluates those signals to detect defects in hard disk 104. Certifier circuit 132 also includes a pattern or frequency generator for generating the test pattern for writing to hard disk 104 by circuit 130. Microprocessor 120 is coupled to both circuits 130 and 132 to control read and write operations. The operation of certifier circuit 132 is described in greater detail below.

In the case that write only head 114 is provided, the read/write preamplifier circuit associated therewith is also coupled to both microprocessor 120 and certifier circuit 132 to control writing operations.

Figure 1B:
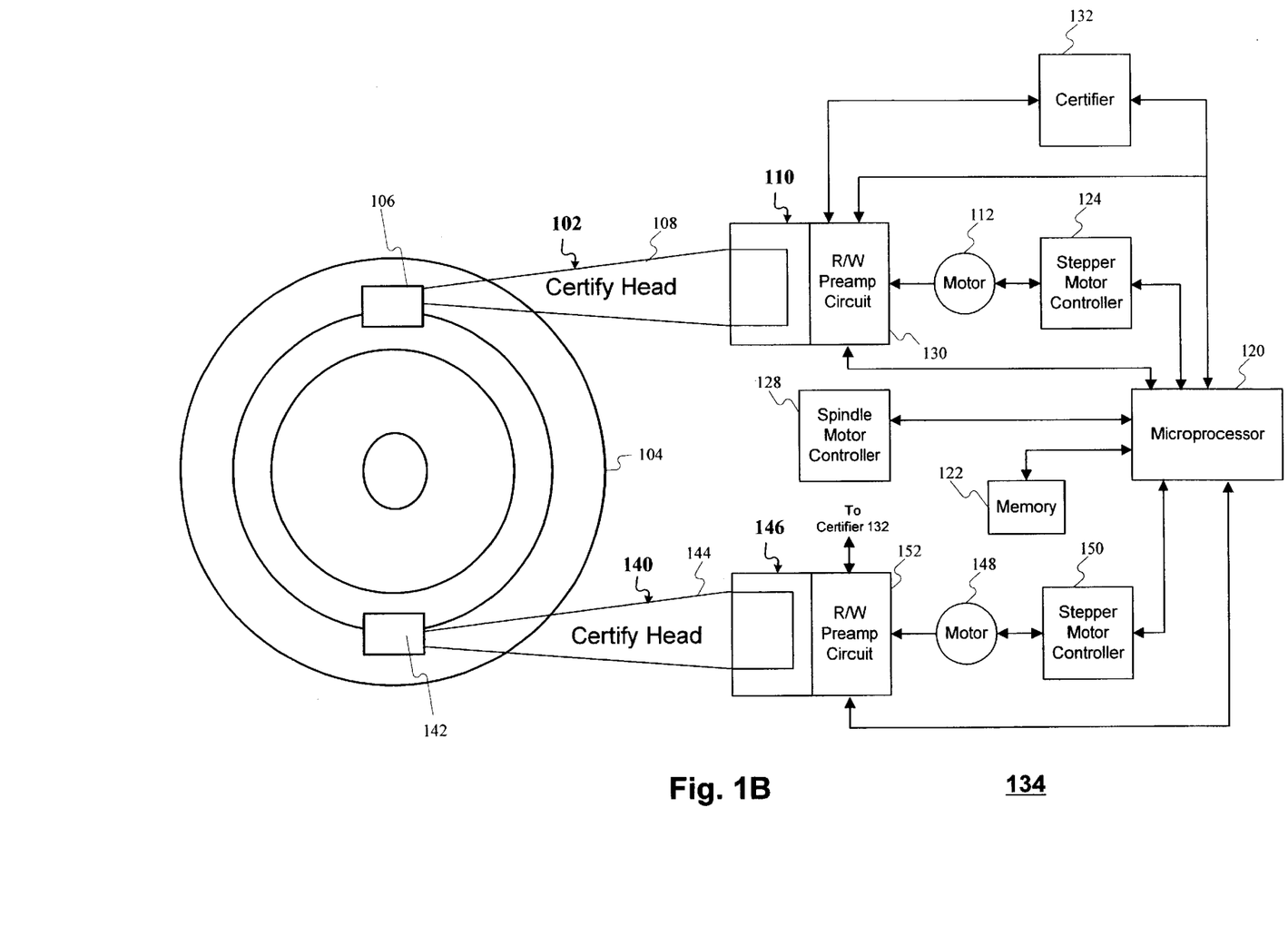

FIG. 1B illustrates apparatus 134 that represents a variation of apparatus 100, in which a second certify head 140 is provided, so that apparatus 134 includes a total of two certify heads. Certify head 140 includes a read/write head 142 positioned over hard disk 104 by a load beam 144. One end of load beam 144 is attached to head 142 and its opposite end is attached to an HLM 146. HLM 146 is radially moved inward and outward relative to hard disk 104 by a high precision linear stepper motor 148. A stepper motor controller 150 is coupled between motor 148 and microprocessor 120. A read/write preamplifier circuit 152 is coupled to read/write head 142 and functions substantially the same way as circuit 130. Circuit 152 is coupled to microprocessor 120 and certifier circuit 132.

As described more fully below, when both of certify heads 102 and 140 are provided, defect detection can be simultaneously conducted by both certify heads to increase the speed of detection.

Figure 2:
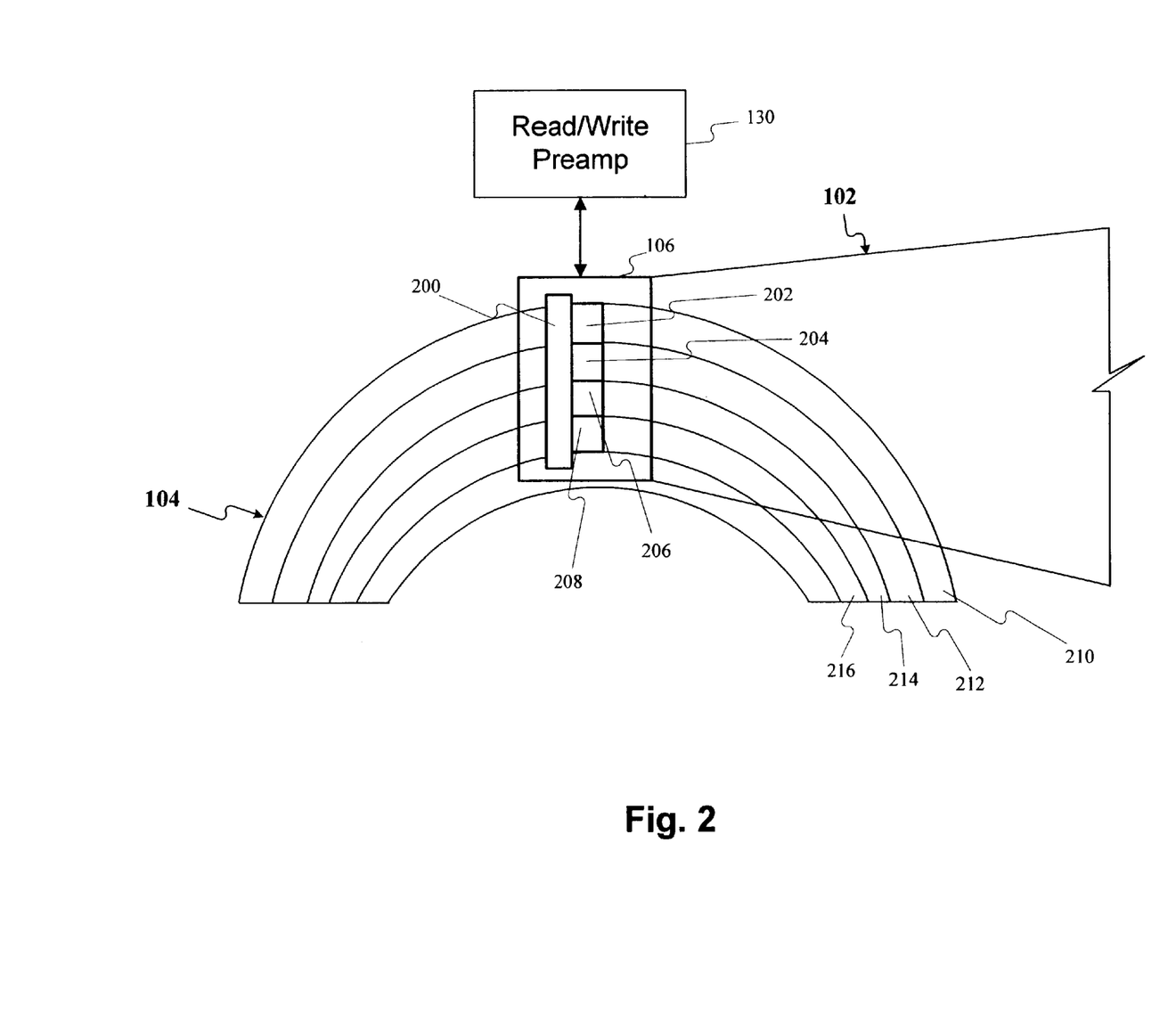

FIG. 2 schematically illustrates in greater detail an embodiment of certify head 102, including read/write head 106, consistent with the present invention. With reference to FIG. 2, read/write head 106 includes a write element 200 and a plurality of, e.g., four read elements 202, 204, 206, and 208 which are positioned over and aligned with track areas 210, 212, 214, and 216, respectively, on disk 104 on which have previously been written test patterns. In the present embodiment, the actual configuration of read elements 202–208 only requires that the elements together can be simultaneously positioned over four adjacent tracks of the disk being tested. Write element 200 preferably has a width, measured across track areas 210–216, greater than the combined width of read elements 202–208. For example, write element 200 can be wider than the combined width of read elements 202–208 by a factor of 1.25–3.0. This insures that the write element can magnetize the entire area corresponding to track areas 210–216.

Read/write head 106 and the read elements thereof are preferably provided as magnetoresistance effect (MR) elements. MR elements can have a variety of constructions and are well known in the art. Examples of the construction of MR elements are disclosed in U.S. Pat. Nos. 4,071,868, 5,568,335, 5,754,376, and 5,081,554. The respective read elements 202–208 each have a width sufficiently small to enable writing to and reading from disk 104 with a density at least as large as the intended recording density of disk 104. As a result, read/write head 106 provides a desired sensitivity for detecting defects in the magnetic layer and/or substrate of disk 104. For example, in accordance with one of the techniques noted above for detecting defects, the test signal read from the disk is a series of sinusoidal data pulses. If the amplitude of one of the sinusoidal pulses of the read signal fails to reach a threshold value that is a predetermined percentage of an expected amplitude of the pulses, then the location on the disk corresponding to that particular pulse is determined to contain a defect. Equation (1) provides a relationship between a critical defect size (CD) corresponding to the smallest defect size that is expected to cause read/write errors for the intended recording density for the magnetic medium and is, therefore, to be detected, the width of the read element, and the signal amplitude threshold:

$$CD=(1-\text{threshold})\times(\text{read element width}) \quad (1)$$

For recording densities of approximately 8 Gbit/in$^2$, a value of CD is approximately 0.2 μm. For recording densities greater than 8 Gbit/in$^2$, the value of CD should be decreased with increasing recording density. As recording density/areal density increases, the bit density and track density increase, which causes the space for the same number of recorded bits to shrink, therefore, CD will become smaller. The value CD=0.2 is exemplary and does not correspond to a specific recording density. If the threshold value is set at too high a percentage, e.g. 90%, the test results may be over-inclusive. This is because a single pulse having a nominal value only marginally less than or equal to 90% will be treated as corresponding to a defect. However, this type of 90% threshold rejected defect would not cause a read/write error in a magnetic medium drive application. Indeed, pulses of such amplitude may be caused by phenomena unrelated to defects, e.g., grain size distribution in the magnetic layer. A preferred threshold value is about 60–75%. Considering, for example, a threshold value of 75%, based on equation (1), a CD of 0.2 μm yields a read element width of 0.8 μm.

It may also be useful to set multiple thresholds to be applied during testing to, for example, enable the grading of products.

Equation (1) also illustrates that by increasing the read element width, sensitivity to defect size is decreased as may be done in conventional testing to increase throughput while failing to detect defects having a size smaller than CD.

Figure 3:
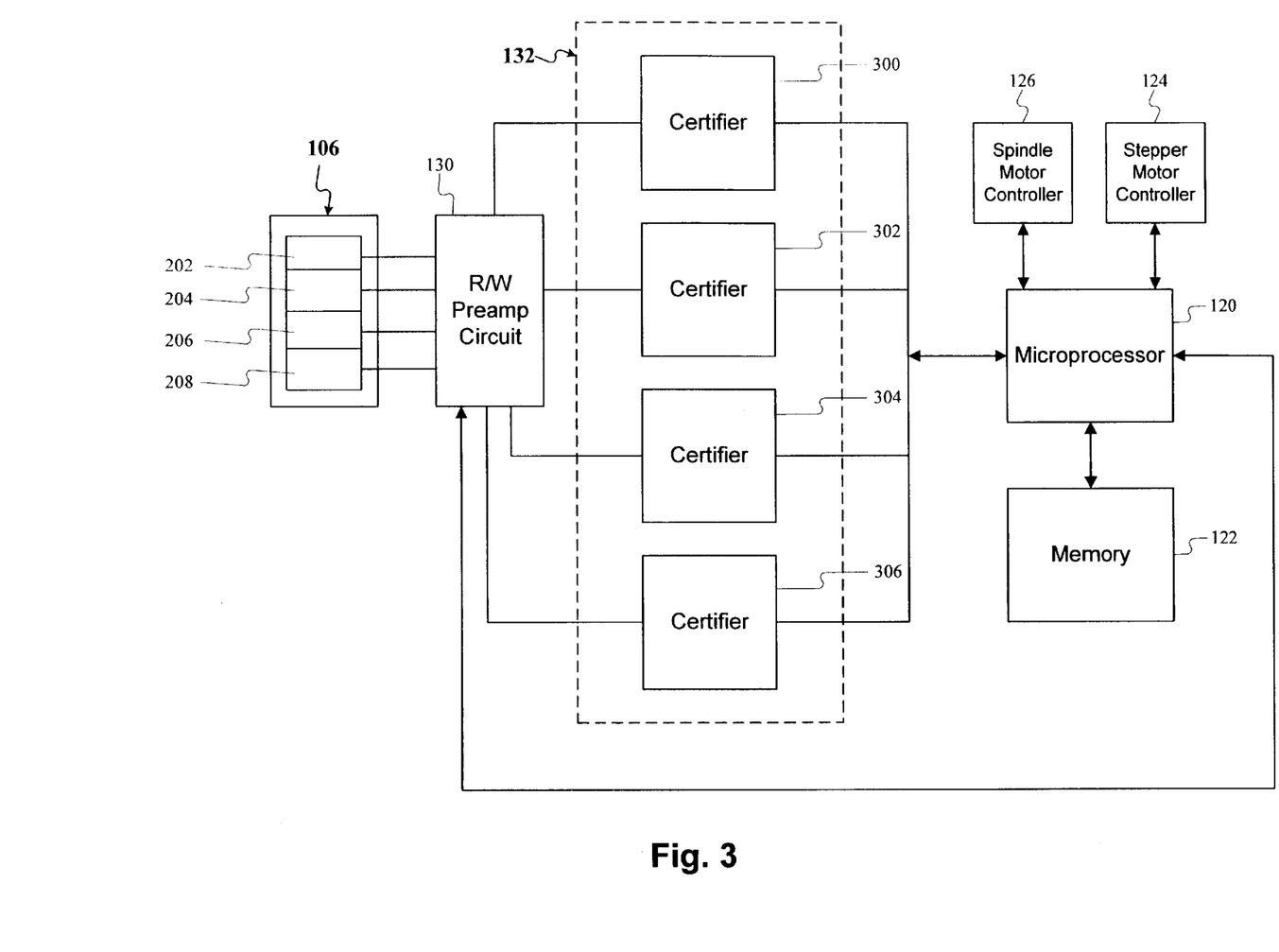
FIG. 3 diagrammatically illustrates an embodiment of disk defect detection apparatus consistent with the present invention.

FIG. 3 diagrammatically illustrates an embodiment of disk defect detection apparatus consistent with the present invention including multichannel certifier circuit 132 and the connection thereof to receive the read signals from read/write head 106 after amplification by circuit 130. For convenience, write element 200 is not shown. Certifier circuit 132 includes certifier circuit portions 300, 302, 304, and 306, coupled to circuit 130 to receive respective amplified read signals provided by read elements 202, 204, 206, and 208 through circuit 130. Each certifier circuit portion includes signal processing circuitry for evaluating the read signal from its corresponding read element to detect defects in the magnetic medium and/or substrate. The signal processing circuit included in each certifier circuit 300–306 is adapted to perform defect detection in accordance with any conventional technique or techniques. For example, each circuit portion 300–306 may be adapted to compare the sinusoidal pulses of a test signal read from disk 104 to a predetermined threshold, e.g., set at 75% of full pulse amplitude, and provide a defect detection output for each pulse having an amplitude less than the threshold.

The detection results of the certifier circuit portions are provided to microprocessor 120 which causes them to be stored in memory 122 or in a storage device such as a hard disk drive of a PC in which microprocessor 120 is embodied. Microprocessor 120 further correlates detected errors with their physical locations on hard disk 104. With such information determined by microprocessor 120, it can be programmed to provide a report with information of particular interest to the user. For example, for each defect, the report can specify the radius at which, and the sector within which, the defect occurs and the bit length of the defect. Providing the bit length of the defect further enables each defect to be characterized as correctable or non-correctable, i.e., whether or not the defect will cause a malfunction in the operation of the drive in which it is ultimately installed.

In operation, the manner in which writing and subsequent reading of a test signal depends on whether apparatus 100 is provided with a single certify head 102 alone or with write only head 114, or whether apparatus 134 is provided with multiple certify heads, such as 102 and 140 (FIG. 1B). If single certify head 102 including its read/write head 106 is provided, apparatus 100 is first operated to write a test signal onto disk 104 utilizing head 106 and subsequently to read the test signal by again utilizing head 106. The test signal read from disk 104 is processed to identify defects as further described below.

If apparatus 100 includes both certify head 102 and write only head 114, heads 102 and 114 can be positioned at diametrically opposite positions over disk 104, i.e., positioned 180° apart, by microprocessor 120 via their respective stepper motor controllers and stepper motors over the same track at the same time. Then, head 114 is controlled to write the test signal onto disk 104 and head 102 is controlled to read that test signal as the recorded track on disk 104 rotates into position for reading by head 102. As each track is written and read, the respective heads 102 and 114 are moved by discrete steps to write to and read from successive tracks. The test signal read from disk 104 is processed to identify defects. However, when a defect is detected, microprocessor 120 stops writing of the test signal and the track containing the apparent defect is re-read to verify the existence of the defect. After completion of verification, the writing and reading of successive tracks again commences.

If apparatus 134 is provided including two certify heads 102 and 140 positioned at diametrically opposite positions over disk 104, as shown in FIG. 1B, the heads are preferably controlled so that one head is controlled to move stepwise from an innermost radius to a middle radius to cover an inner radial portion of disk 104, while the other head is controlled to move stepwise from the outermost radius to the middle radius to cover an outer radial portion of disk 104. In this manner, heads 102 and 140 are moved simultaneously so that the inner and outer radial portions are simultaneously tested for defects. More particularly, first, heads 102 and 140 are moved stepwise under control of microprocessor 120 to record the test signal on disk 104. Then, heads 102 and 140 are again moved stepwise under control of microprocessor 120 to read the test signal from disk 104. Since the two heads 102 and 140 simultaneously operate to write to, and read from, disk 104, the time for conducting the entire operation is substantially halved.

Each step movement of HLM 110 when head 102 is provided alone or HLMs 110 and 146 when both heads 102 and 140 are provided, is recorded by microprocessor 120 and is converted into a physical radial position on disk 104 for assessment of disk integrity as well as for subsequent engineering mode media failure analysis. With physical radius and circumferential position information, it is also possible for microprocessor 120 to determine sector information. For example, hard disk 104 may be divided into 1024 sectors.

During simultaneously reading of the test signals by read elements 202–208, the readback signals from all read elements are analyzed according to the threshold value set in each of certifier circuit portions 300–306, e.g., 75%. If any bit/pulse of the readback signal has a magnitude below this threshold, the certifier circuit will pass this information to the microprocessor 120 and it will be recorded as a defect, e.g., optionally characterized as a missing pulse. Microprocessor 120 will also record the location of the defect, such as by its physical radius and sector. By accumulating information regarding successive missing pulses, microprocessor 120 can also record the bit length of a defect. Thus, microprocessor 120 accumulates the number of defects the system found during the entire surface analysis of disk 140. Extra pulse, modulation, and thermal asperity defects can also be detected by apparatus 100. These defects are defined in the standards of the International Disk Equipment and Material Association (IDEMA) located in Sunnnyvale, Calif. The defect information can be used to categorize the media according to its grade. The defect information is also useful to create an error map for further engineering mode failure analysis use. In the process of evaluating the readback signals, it may be desirable to read the same track more than once to confirm the existence of defects.

The defect detection of each track preferably includes a retry cycle in which the test signal is read again and evaluated to determine whether any defects are present.

As defect detection of each track is completed, the microprocessor controls the certify head and, if present, the write only head to move by one step radially inward or outward as appropriate. The step size as noted above is selected according to the required recording density of the disk but is typically equal to the combined width of the read elements, e.g., read elements 202–208 of head 106.

Since read elements 202–208 each have a width that is sufficiently small to enable detection of critical defects and since an annular area of disk 104 corresponding to four tracks is scanned during each revolution of the disk, the testing of disk 104 proceeds at a high rate, with high sensitivity, and covers 100% of the usable disk surface. However, the user can set the step size for head movement to provide a different surface coverage, i.e., less than 100% coverage.

Figure 4:
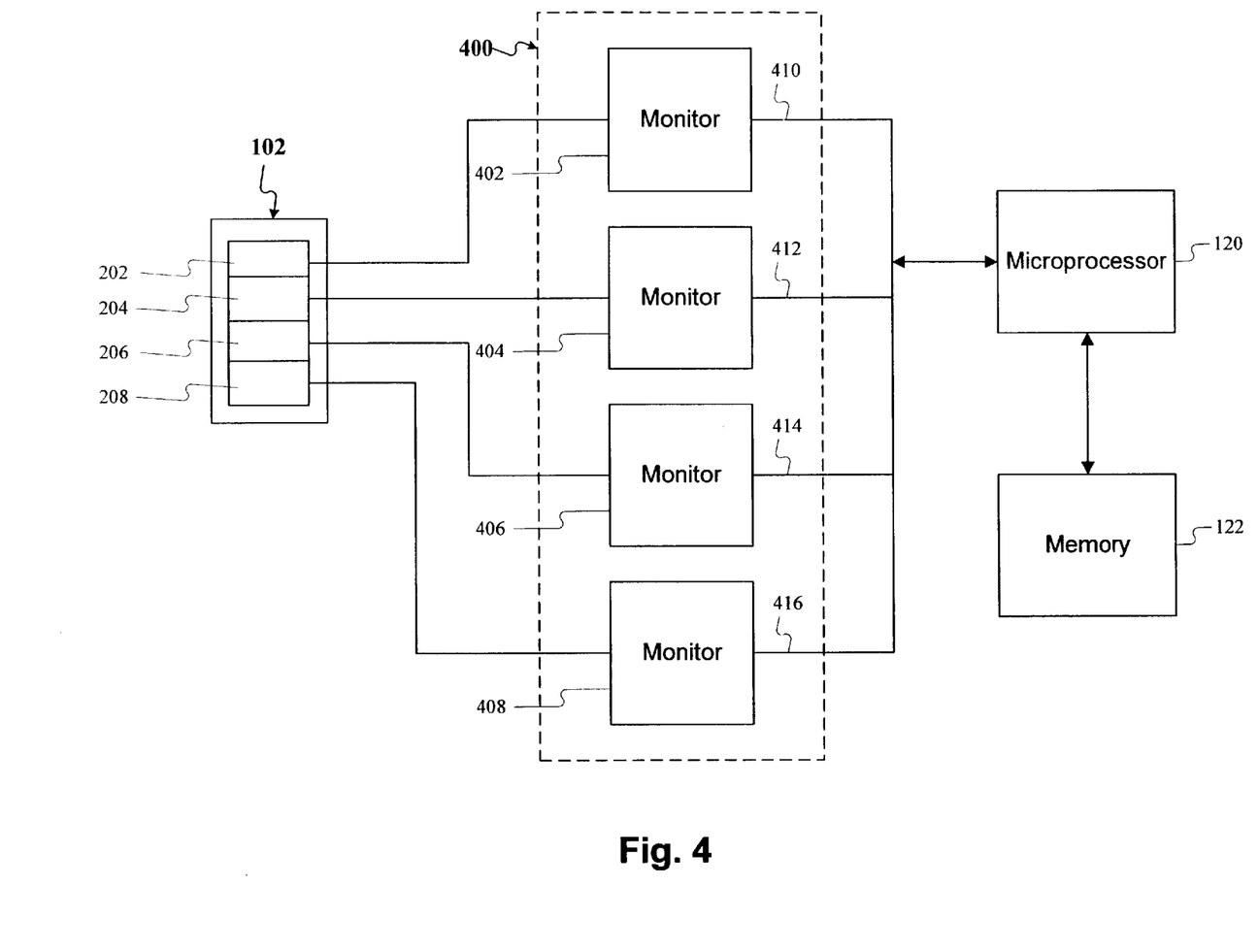
FIG. 4 diagrammatically illustrates a multichannel read/write element monitor consistent with the present invention.

FIG. 4 diagrammatically illustrates a multichannel read/write element monitor circuit 400 consistent with the present invention and the connection thereof to certify head 102. Monitor circuit 400 is preferably included within read/write preamplifier circuit 130 or may be coupled to an output port thereof. Monitor circuit 400 includes monitor circuit portions 402, 404, 406, and 408 respectively coupled to read elements 202, 204, 206, and 208. For convenience, write element 200 is not shown. Each monitor circuit portion 402–408 includes circuitry for monitoring the integrity of the corresponding read element to which it is connected and for providing an output signal upon detecting that its corresponding read element is malfunctioning. Thus, monitors 402, 404, 406, and 408 provide a malfunction signal output on their respective outputs 410, 412, 414, and 416 when any of read elements 202, 204, 206, and 208, respectively, are detected to be malfunctioning.

Figure 5:
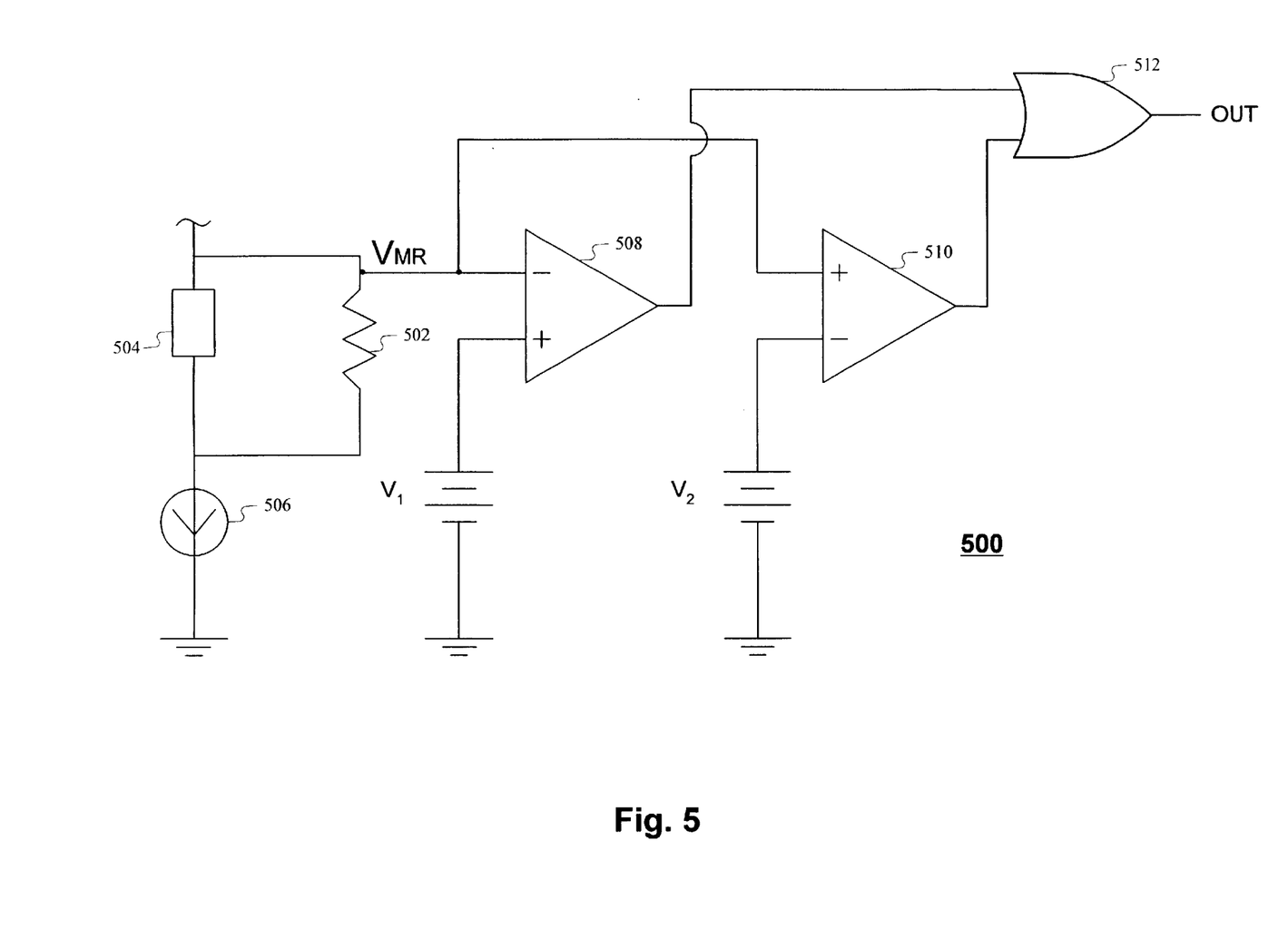
FIG. 5 illustrates a possible configuration of a monitor circuit portion shown in FIG. 4.

The type of circuitry provided for each monitor circuit portion depends on the type of read element being utilized. FIG. 5 illustrates an example of the monitor circuit portion when read elements are provided as MR elements. With reference to FIG. 5, a monitor circuit portion 500 includes a resistor 502 connected across an MR read element 504 being monitored. Circuit portion 500 includes a current source 506 for driving a predetermined current through element 504 when the element is tested. A voltage $V_{MR}$ developed across the parallel combination of element 504 and resistor 502 is applied to the inverting input of a comparator 508 implemented with an operational amplifier (op-amp). The voltage $V_{MR}$ is also applied to the non-inverting input of an op-amp which serves as a comparator 510. The non-inverting input of comparator 508 is connected to a first DC reference voltage $V_1$. The inverting input of comparator 510 is connected to a second DC reference voltage $V_2$. $V_1$ is selected to have a value less than $V_{MR}$ under normal conditions, while $V_2$ has a value greater than $V_{MR}$ under normal conditions. Thus, $V_1<V_2$. The respective outputs of comparators 508 and 510 are connected to inputs of OR gate 512 An output OUT of OR gate 512 provides an indication when element 504 is malfunctioning.

Circuit 500 is configured to detect the malfunction of element 504 by its failing in either an open circuit or short circuit condition. In the event of the short circuit condition, the voltage $V_{MR}$ drops below $V_1$ and the logical output of comparator 508 changes from 0 to 1. In the event of an open circuit condition, the voltage $V_{MR}$ increases above $V_2$ and the logical output of comparator 510 changes from 0 to 1. As a result, the value of OUT outputted by OR gate 512 becomes logical 1 when element 504 fails in either the short circuit or open circuit condition. By the nature of its operation, circuit 500 cannot be operated while the read elements of head 102 are actively reading information. Thus, circuit 500 may be operated during a period of time when data is only being written to but not read from a disk being tested or when a disk is not being tested. At a user's discretion, circuit 500 can be enabled to operate after selected revolutions of the disk during a test operation, although each such operation of circuit 500 will add to the total time required to complete testing of the disk and thereby affect system throughput.

In accordance with another embodiment of the invention, separate circuitry to monitor read elements 202–208 is not provided. Instead, successive values of the read signal from each element are compared. When there is a predetermined change in the read signal value relative to previous values, a malfunction of the read element is determined to have occurred. For example, the average signal amplitude for an entire track from a particular read element can be compared with an arbitrary value set by the user. Then, if the average signal from the particular element significantly differs from the arbitrary value, then the particular element is determined to be defective. The successive values of the read signal may be stored by microprocessor 120 in memory 122 for monitoring in accordance with criteria for determining whether the corresponding element has malfunctioned. In this case, either or both DC reference voltages $V_1$, $V_2$ may be provided by a programmable reference voltage source. This enables the setting of the reference voltages as a function of the average signal value of a previously read track.

In accordance with a further aspect of the present invention, upon determining that a read/write element has malfunctioned, certify head 102 is controlled to continue to read desired tracks of hard disk 104 without using the malfunctioning element. For example, in the case that a test signal has been recorded on 100% of the tracks of hard disk 104, microprocessor 120 controls stepper motor controller 124 to move certify head 102 such that the remaining functioning read elements are successively positioned over substantially all tracks to test substantially 100% of the surface of disk 104.

Figure 6:
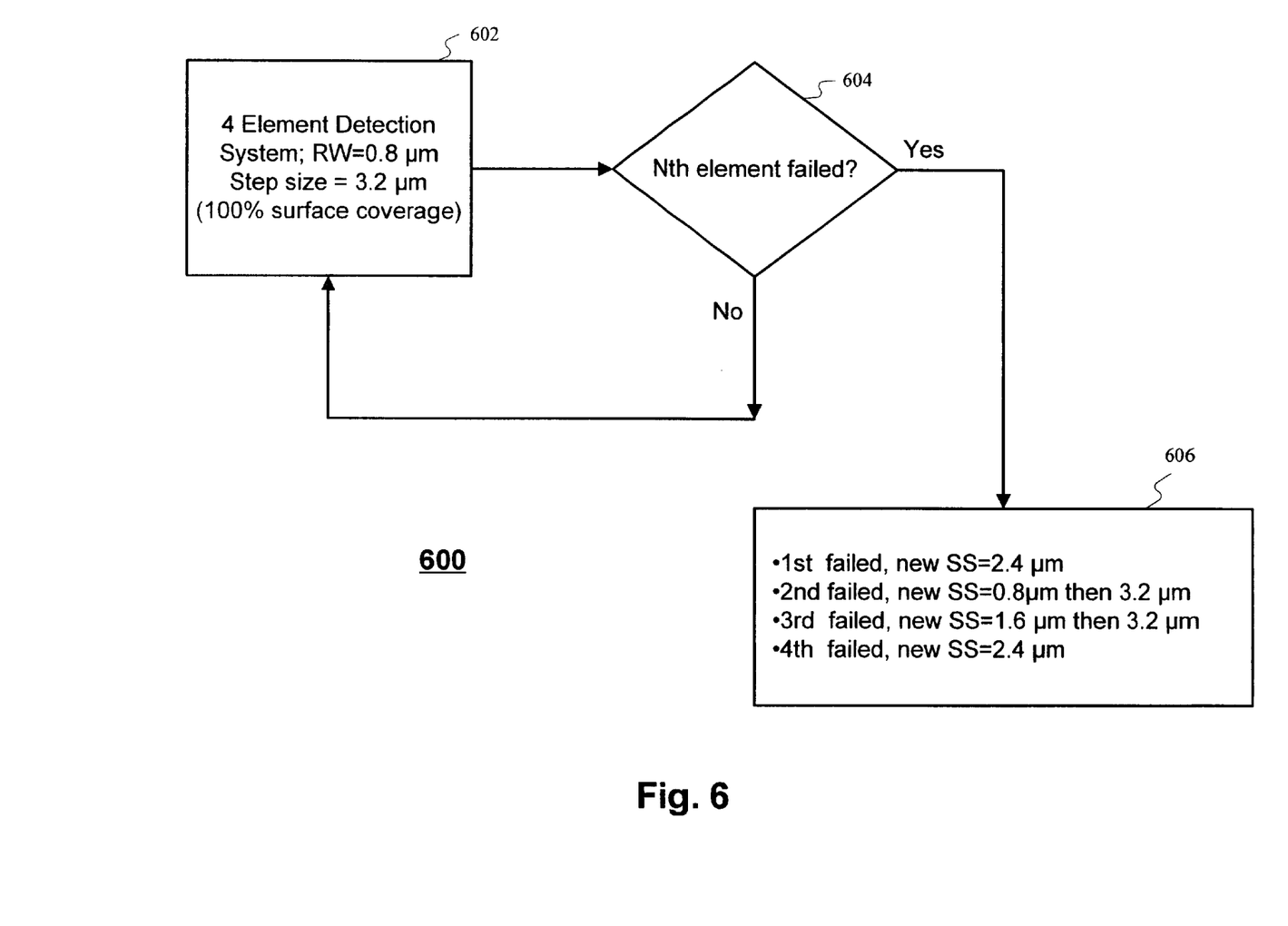
FIG. 6 illustrates a flow chart for controlling radial movement of a read head.

FIG. 6 illustrates a flow chart 600 for controlling a radial movement step size of head 106. Flow chart 600 is based on an example in which the width of each read element 202–208 in the radial direction of disk 104 is 0.8 μm and that the read elements are contiguous in the radial direction. As a result, the combined width of the four elements 202–208 is 3.2 μm. Further, for convenience of explanation, elements 202–208 are respectively referred to as the first through fourth elements.

Figure 7A:
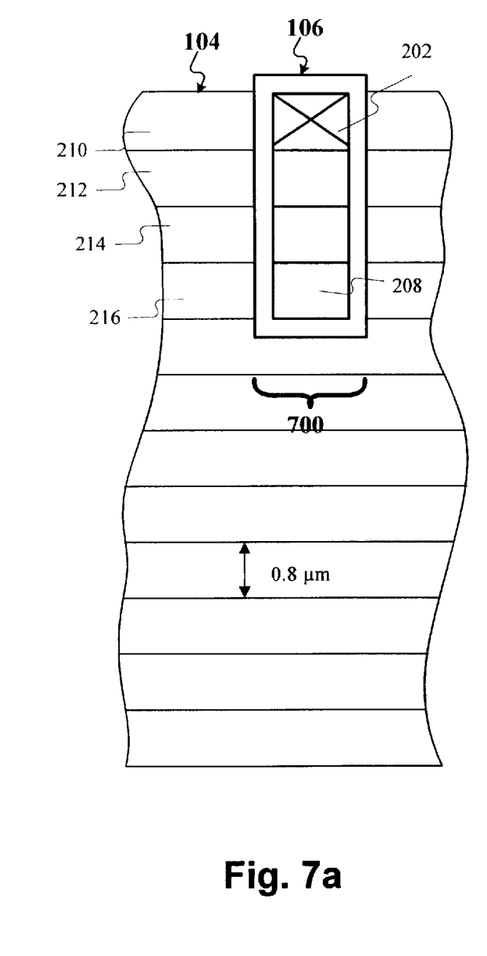
FIGS. 7a–7f illustrate successive positions of a read head controlled in accordance with the flow chart in FIG. 6.
Figure 7B:
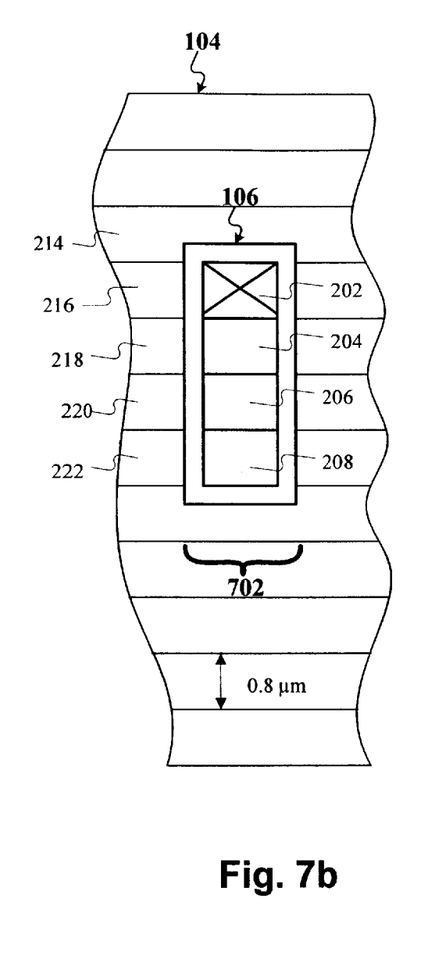
Figure 7C:
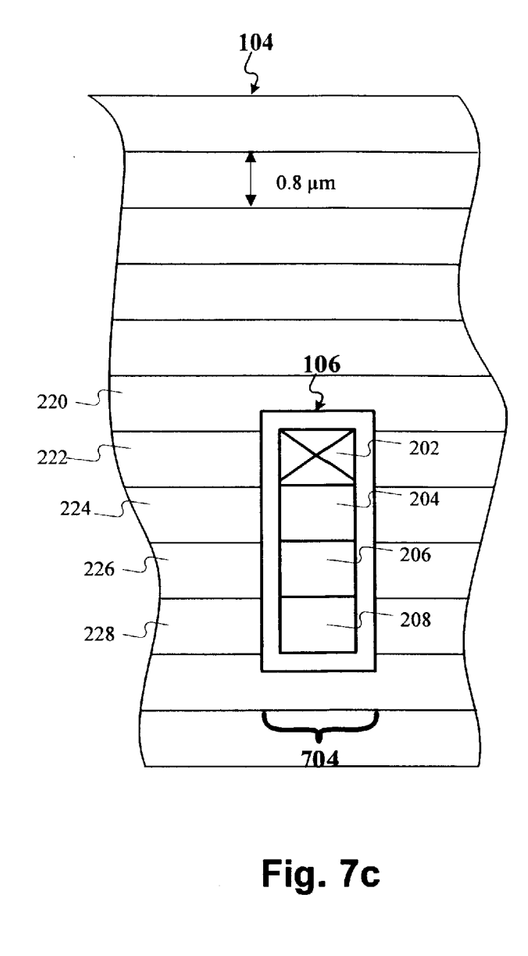

FIGS. 7a–7c illustrate three successive positions 700, 702, and 704, respectively, to which head 106 is moved by microprocessor 120 when element 202, i.e., the first element, has malfunctioned. In FIG. 7a, head 106 is diagrammatically positioned over tracks 210–216 of hard disk 104. For convenience, the curvature of the tracks is not shown in FIGS. 7a–7c.

With reference also to flow chart 600 in FIG. 6, in step 602, the number of elements in head 106 (four in this example), the read width (RW) of each element (in this example 0.8 μm), and a radial step size of head 106 to achieve 100% coverage of disk 104 assuming no malfunctioning elements (in this example 3.2 μcm) are initially established. In step 604, so long as none of read elements 202–208 malfunction, the step size of 3.2 μm is maintained. However, if one of read/write elements 202–208 malfunctions, the flow chart proceeds to step 606 where a new step size is assigned. If element 202, i.e., the first element, malfunctions, then the step size is changed to 2.4 μm. With reference to FIG. 7a, when head 106 is in position 700, the outermost track 210 is not read. With reference to FIG. 7b, servo controller 122 then moves head 106 by the 2.4 μm step size to position 702 so that malfunctioning element 202 is positioned over track 216 that was previously read by element 208 in position 700. In position 702, elements 204, 206, and 208 read tracks 218, 220, and 222, respectively. With reference to FIG. 7c, when microprocessor 120 moves head 106 by 2.4 μm to position 704, malfunctioning element 202 is positioned over a track 222 that was previously read by element 208 in position 702. In position 704, elements 204, 206, and 208 read tracks 224, 226, and 228, respectively. In this way, although outermost track 210 is never read, all other tracks of disk 104 are read. As a result, even though element 202 has malfunctioned, defect detection of disk 104 can still be carried out at a high rate.

Figure 7D:
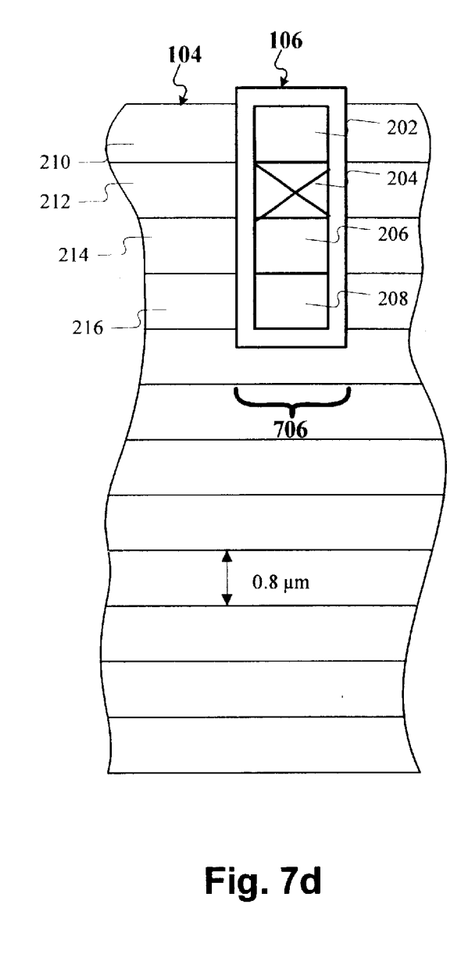
Figure 7E:
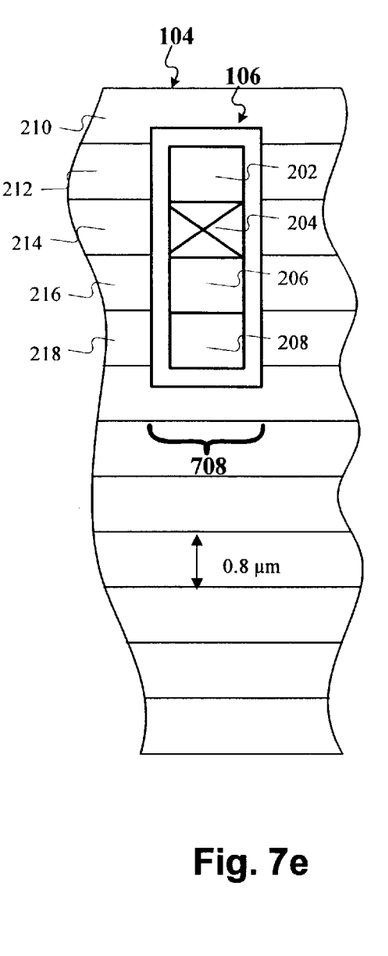
Figure 7F:
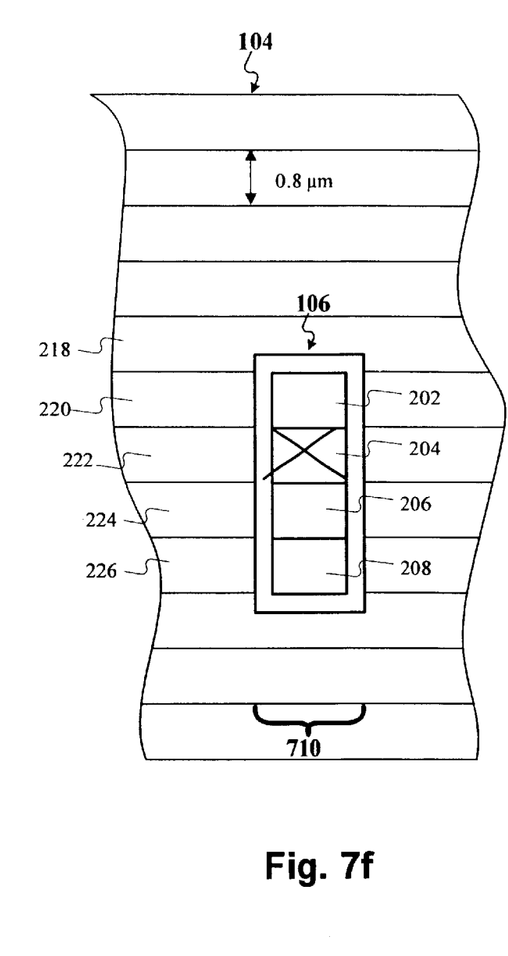

FIGS. 7d–7f illustrate an example in which element 204, the second element, has malfunctioned. Step 606 of flow chart 600 requires that when the second element has malfunctioned, the step size successively alternates between 0.8 μm and 3.2 μm. Thus, with reference to FIG. 7d, when head 106 is in a first position 706, malfunctioning element 204 is positioned over track 212 and that track is not read. However, elements 202, 206, and 208 read tracks 210, 214, and 216, respectively. With reference to FIG. 7e, servo controller 122 then moves head 106 by a 0.8 μm step size to a second position 708 so that element 202 reads track 212 and element 208 reads track 218 that was not previously read. With reference to FIG. 7f, servo controller 122 then moves head 106 by a 3.2 μm step size to a third position 710 so that element 204 is positioned over track 222 and that track is not read. However, elements 202, 206, and 208 read tracks 220, 224, and 226, respectively, that were not previously read. With the step size so alternated, all tracks of disk 104 are read.

While embodiments consistent with the present invention have been described, the invention is not so limited thereby. For example, while the read and write elements of certify head 102 are disclosed as preferably being MR elements, the invention is not so limited. The elements can instead be provided as magnetic inductive type elements or magnetic-optical sensors, provided the elements can read and write with a data density commensurate with the intended density of the disk being tested.

While certify head 102 has been disclosed as including a read/write head including four read elements, the invention can be practiced with equal effectiveness with a read or read/write head including a number of read elements greater or lesser than four. As the number and size of the read elements are changed, the step sizes in flow chart 600 need to be adjusted accordingly.

It will be apparent to those skilled in the art that various modifications and variation can be made in the apparatus and the method of the present invention without departing from the spirit or scope of the invention. Thus, it is intended that the present invention cover the modifications and variation of this invention provided they come within the scope of the appended claims and their equivalents.

What is claimed is:

1. An apparatus for reading a plurality of information tracks in a magnetic storage medium, comprising:

a read head including a plurality of read elements each producing a read signal in response to data stored in the tracks of the storage medium, each read element is a magnetoresistance effect element; and an element monitoring circuit to monitor said plurality of elements and provide an indication when one of said elements malfunctions, said monitoring circuit comprising a comparator coupled to receive an element voltage across one of said elements on a first input and a reference voltage on a second input and provide the malfunction indication when the element voltage changes relative to the reference voltage in a predetermined way, wherein said reference voltage is a programmable reference voltage.

2. The apparatus of claim 1 wherein the value of said programmable reference voltage is determined by an average read signal of a previously read track.

3. An apparatus for reading a plurality of information tracks in a magnetic storage medium, comprising:

a read head including a plurality of read elements each producing a read signal in response to data stored in the tracks of the storage medium;

an element monitoring circuit to monitor said plurality of elements and provide an indication when one of said elements malfunctions;

means for positioning said read head over said storage medium; and means for controlling said positioning means, said controlling means responsive to the indication that one of the storage elements is malfunctioning to position said read head to read predetermined ones of the tracks of the storage medium without using the malfunctioning element.

4. The apparatus of claim 3 further including means for determining a step size for movements of said positioning means as a function of which of said plurality of read elements is malfunctioning.

5. The apparatus of claim 3 wherein said controlling means controls said positioning means to read substantially all tracks of the storage medium; and means for determining a step size for movements of said positioning means as a function of which of said plurality of elements is malfunctioning, so that substantially all tracks of the storage medium are read.

6. The apparatus of claim 5 wherein said magnetic storage medium is a magnetic disk; and wherein said plurality of elements are mounted in said read head adjacent to one another for positioning over respective adjacent tracks of the magnetic disk.

7. Apparatus for reading a plurality of information tracks in a magnetic storage medium, comprising:

a read head including a plurality of read elements each producing a read signal in response to data stored in the storage medium;

means for storing a plurality of the read signals output by a selected one of said read elements; and means for comparing at least one of the stored read signals with at least one subsequent read signal output by said selected read element, for determining whether said selected read element malfunctions, and for providing an indication when said read element malfunctions.

8. The apparatus of claim 7 wherein said storing means stores successive values of the read signals output by said plurality of read elements and said comparing means determines whether any of said plurality of read elements malfunctions and provides the indication when any of said read elements malfunctions;

said apparatus further including:

means for positioning said read head over said storage medium; and means for controlling said positioning means, said controlling means responsive to the indication that one of said elements is malfunctioning to position said read head to read predetermined ones of the tracks of said medium without using the malfunctioning element.

9. The apparatus of claim 8 further including means for determining a step size for movements of said positioning means as a function of which of said plurality of elements is malfunctioning.

10. The apparatus of claim 8 wherein said controlling means controls said positioning means to read substantially all tracks of the storage medium; and means for determining a step size for movements of said positioning means as a function of which of said plurality of elements is malfunctioning, so that substantially all tracks of the storage medium are read.

11. The apparatus of claim 10 wherein said magnetic storage medium is a magnetic disk; and wherein said plurality of elements are mounted in said read head adjacent to one another for positioning over respective adjacent tracks of the magnetic disk.

12. A method for reading a plurality of information tracks in a magnetic storage medium, comprising:

producing read signals from a plurality of read elements in response to data stored in the track of the storage medium;

monitoring the plurality of read elements to determine when any one of the read elements malfunctions;

providing an indication when any one of the read elements is determined to be malfunction;

positioning the read head over the storage medium; and controlling the position of the read head, in response to the indication that one of the read elements is malfunctioning, to read predetermined ones of the tracks of the storage medium without using the malfunctioning element.

13. The method of claim 12 further including determining a step size for movement of the read head as a function of which of the plurality of read elements is malfunctioning.

14. The method of claim 12 wherein controlling the read head position includes controlling the read head to read substantially all tracks of the storage medium;

the method further including determining a step size for movements of the read head as a function of which of the plurality of read elements is malfunctioning, so that substantially all tracks of the storage medium are read.

15. A method for reading a plurality of information tracks in a magnetic storage medium, comprising:

producing read signals from a plurality of read elements in response to data stored in the storage medium;

storing ones of the read signals output by a selected one of the read elements;

comparing at least one of the stored read signals with at least one subsequent read signal output by the selected read element;

determining whether the selected read element is malfunctioning based on a result of the comparing; and providing an indication when the selected read element is malfunctioning.

\* \* \* \* \*